(12) United States Patent
Yin et al.

(10) Patent No.: US 12,273,645 B2
(45) Date of Patent: Apr. 8, 2025

(54) IMAGE SENSOR AND OPERATION METHOD THEREOF

(71) Applicant: Guangzhou Tyrafos Semiconductor Technologies Co., LTD, Guangzhou (CN)

(72) Inventors: Ping-Hung Yin, Taipei (TW); Jia-Shyang Wang, Miaoli County (TW); Shih-Chan Tai, Kaohsiung (TW)

(73) Assignee: Guangzhou Tyrafos Semiconductor Technologies Co., LTD, Guangzhou (CN)

( * ) Notice: Subject to any disclaimer, the term of this patent is extended or adjusted under 35 U.S.C. 154(b) by 181 days.

(21) Appl. No.: 18/308,679

(22) Filed: Apr. 28, 2023

(65) Prior Publication Data

US 2023/0370744 A1 Nov. 16, 2023

Related U.S. Application Data

(60) Provisional application No. 63/341,423, filed on May 13, 2022.

(51) Int. Cl.
*H04N 25/78* (2023.01)
*G06F 1/08* (2006.01)
(Continued)

(52) U.S. Cl.
CPC ............... *H04N 25/78* (2023.01); *G06F 1/08* (2013.01); *H01L 25/0753* (2013.01);
(Continued)

(58) Field of Classification Search
CPC ...... H04N 25/78; H04N 25/60; H04N 25/627; H04N 25/63; H04N 25/709; H04N 25/77;
(Continued)

(56) References Cited

U.S. PATENT DOCUMENTS

| | | | |
|---|---|---|---|
| 2006/0192870 A1* | 8/2006 | Shoho | H04N 25/778 348/E3.018 |
| 2010/0271248 A1* | 10/2010 | Yamaoka | H04N 25/78 327/131 |

(Continued)

OTHER PUBLICATIONS

"Office Action of Taiwan Counterpart Application", issued on Sep. 5, 2023, p. 1-p. 6.

*Primary Examiner* — Albert H Cutler
(74) *Attorney, Agent, or Firm* — JCIPRNET

(57) ABSTRACT

An image sensor and an operation method thereof are provided. The image sensor includes a first pixel circuit and a ramp signal generator. The first pixel circuit includes a first pixel unit; a first transfer transistor coupled to the first pixel unit and a first floating diffusion node; a first readout transistor coupled to the first floating diffusion node; a first ramp capacitor coupled to the first floating diffusion node and receiving a first ramp signal; and a first reset transistor coupled to the first floating diffusion node and receiving a reset signal. The ramp signal generator is coupled to the first ramp capacitor and configured to provide the first ramp signal. A voltage range or a counting result of the pixel circuit during at least one of a reset period and a readout period has an offset.

18 Claims, 11 Drawing Sheets

(51) Int. Cl.
*H01L 25/075* (2006.01)
*H01L 25/18* (2023.01)
*H03K 19/0185* (2006.01)
*H03L 7/099* (2006.01)
*H04N 25/60* (2023.01)
*H04N 25/627* (2023.01)
*H04N 25/63* (2023.01)
*H04N 25/709* (2023.01)
*H04N 25/76* (2023.01)
*H04N 25/77* (2023.01)
*H04N 25/772* (2023.01)
*H04N 25/778* (2023.01)
*H10F 39/00* (2025.01)

(52) U.S. Cl.
CPC ..... *H01L 25/18* (2013.01); *H03K 19/018521* (2013.01); *H03L 7/099* (2013.01); *H04N 25/60* (2023.01); *H04N 25/627* (2023.01); *H04N 25/63* (2023.01); *H04N 25/709* (2023.01); *H04N 25/77* (2023.01); *H04N 25/772* (2023.01); *H04N 25/778* (2023.01); *H04N 25/7795* (2023.01); *H10F 39/026* (2025.01); *H10F 39/8037* (2025.01); *H10F 39/811* (2025.01)

(58) Field of Classification Search
CPC ............... H04N 25/772; H04N 25/778; H04N 25/7795; H04N 25/779; H04N 25/771; G06F 1/08; H01L 25/0753; H01L 25/18; H01L 27/14612; H01L 27/14632; H01L 27/14636; H03K 19/018521; H03K 5/01; H03L 7/099; H03L 7/0992
See application file for complete search history.

(56) References Cited

U.S. PATENT DOCUMENTS

| | | | | |
|---|---|---|---|---|
| 2011/0114827 | A1* | 5/2011 | Yamaoka | H03M 1/664 250/214 R |
| 2014/0124648 | A1* | 5/2014 | Yin | H04N 25/771 250/208.1 |
| 2015/0009379 | A1 | 1/2015 | Yan et al. | |
| 2018/0352183 | A1* | 12/2018 | Yin | H04N 25/70 |
| 2021/0176419 | A1* | 6/2021 | Lee | H04N 25/772 |
| 2022/0070398 | A1* | 3/2022 | Watanabe | H04N 25/767 |
| 2022/0124272 | A1 | 4/2022 | Jung et al. | |
| 2023/0421927 | A1* | 12/2023 | Moue | H04N 25/79 |

* cited by examiner

IMAGE SENSOR AND OPERATION METHOD THEREOF

CROSS-REFERENCE TO RELATED APPLICATION

This application claims the priority benefit of U.S. provisional application Ser. No. 63/341,423, filed on May 13, 2022. The entirety of the above-mentioned patent application is hereby incorporated by reference herein and made a part of this specification.

BACKGROUND

Technical Field

The disclosure relates to a sensor, and particularly relates to an image sensor and an operation method thereof.

Description of Related Art

In a process of reading out a sensing unit, a pixel circuit of a general image sensor may use a ramp signal to read out a sensing result of the sensing unit. However, the ramp signal generated by a general ramp signal generator may have a glitch (or spike) phenomenon at a boundary of a most significant bit (MSB) and a least significant bit (LSB) or at some bits, which results in distortion of the readout sensing results in the parts corresponding to certain specific values.

SUMMARY

The disclosure is directed to an image sensor and an operation method thereof, which are adapted to provide an effective image sensing function.

The disclosure provides an image sensor including a first pixel circuit, a ramp signal generator and a ramp signal controller. The first pixel circuit includes a first pixel unit, a first transfer transistor, a first readout transistor, a first ramp capacitor and a first reset transistor. The first transfer transistor is coupled to the first pixel unit and a first floating diffusion node. The first readout transistor is coupled to the first floating diffusion node. The first reset transistor is coupled to the first floating diffusion node, and receives a reset signal. The first ramp capacitor is coupled to the first floating diffusion node and receives a first ramp signal. The ramp signal generator is coupled to the first ramp capacitor and configured to provide the first ramp signal. The ramp signal controller is coupled to the ramp signal generator. The first ramp signal additionally generates an offset voltage through the ramp signal controller, so that a voltage range or a counting result of the pixel circuit during at least one of a reset period and a readout period has an offset.

The disclosure provides an image sensor including a first pixel circuit, a ramp signal generator, a readout circuit and a digital circuit. The first pixel circuit includes a first pixel unit, a first transfer transistor, a first readout transistor, a first ramp capacitor and a first reset transistor. The first transfer transistor is coupled to the first pixel unit and a first floating diffusion node. The first readout transistor is coupled to the first floating diffusion node. The first ramp capacitor is coupled to the first floating diffusion node and receives a first ramp signal. The first reset transistor is coupled to the first floating diffusion node and receives a reset signal. The ramp signal generator is coupled to the first ramp capacitor and configured to provide a first ramp signal. The readout circuit is coupled to the first pixel circuit, and is configured to respectively read out a first analog signal and a second analog signal of the first pixel unit during the reset period and the readout period, and obtain a first digital number and a second digital number according to a counting value of a current counting signal when the first floating diffusion node exceeds a reference voltage. The digital circuit is coupled to the readout circuit and configured to provide the counting signal to the readout circuit. The digital circuit subtracts the second digital number from the first digital number to generate a sensing value. The digital circuit modifies at least one of the first digital number and the second digital number according to an offset value before generating the sensing value.

Based on the above description, the image sensor and the operation method thereof of the disclosure are adapted to effectively eliminate or reduce the influence of a ripple phenomenon of the ramp signal on the readout image sensing result.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
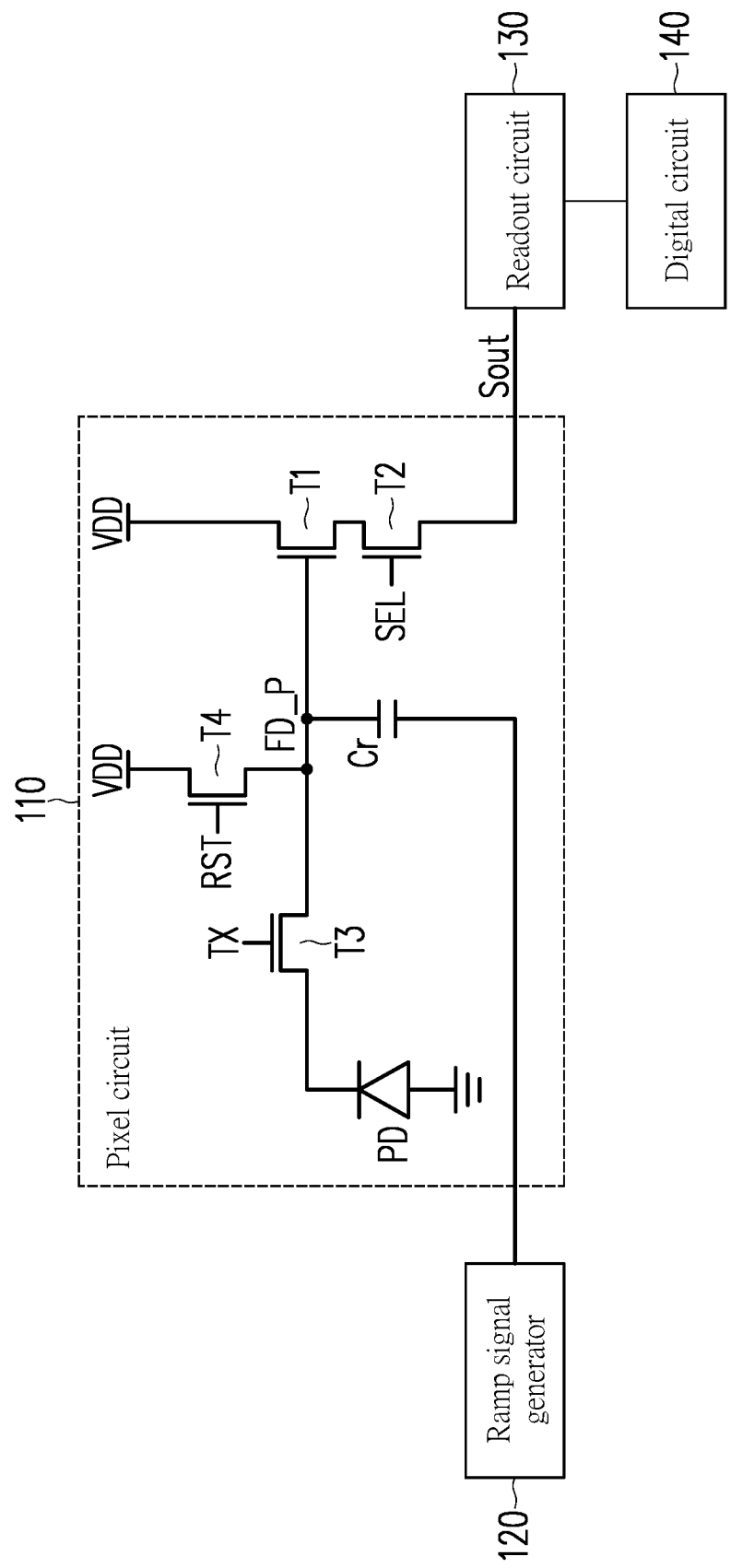
FIG. 1 is a schematic circuit diagram of an image sensor according to an embodiment of the disclosure.

Reference will now be made in detail to the present preferred embodiments of the disclosure, examples of which are illustrated in the accompanying drawings. Wherever possible, the same reference numbers are used in the drawings and the description to refer to the same or like parts.

Figure 2:
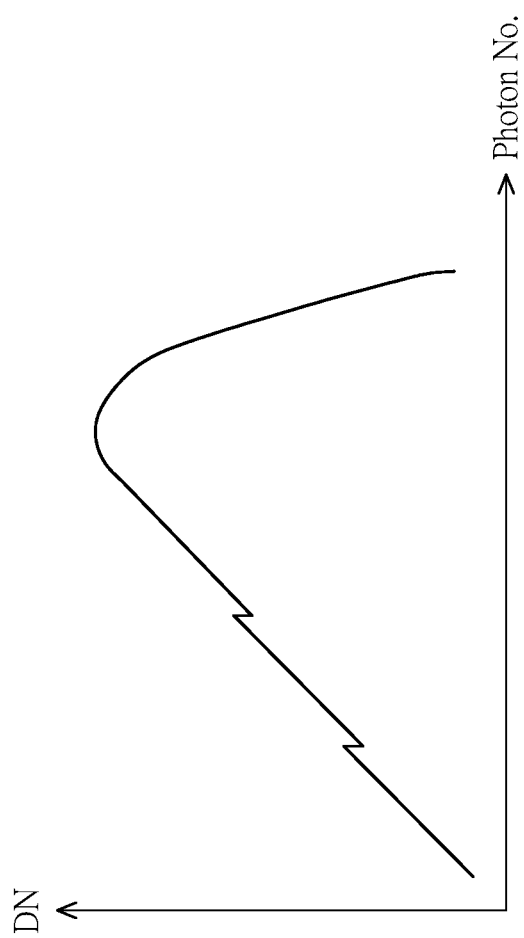
FIG. 2 is a schematic diagram of a photon transfer curve according to an embodiment of the disclosure.

FIG. 1 is a schematic circuit diagram of an image sensor according to an embodiment of the disclosure. FIG. 2 is a schematic diagram of a photon transfer curve according to an embodiment of the disclosure. Referring to FIG. 1, an image sensor 100 includes a pixel circuit 110, a ramp signal generator 120, a readout circuit 130 and a digital circuit 140.

The pixel circuit 110 includes a pixel unit PD, a readout transistor T1, a selection transistor T2, a transfer transistor T3, a reset transistor T4 and a ramp capacitor Cr. The pixel circuit 110 is coupled to the ramp signal generator 120 and the readout circuit 130, and the readout circuit 130 is coupled to the digital circuit 140. In the embodiment, the readout circuit 130 may include a ramp-type analog-to-digital converter (ramp-type ADC), and is configured to convert a sensing result of the pixel unit PD into a digital signal and transmit it to the digital circuit 140, where a ramp signal required by the analog-to-digital conversion is provided to the pixel circuit 110 by the ramp signal generator 120.

In the embodiment, the image sensor 100 performs a digital correlated double sampling (DDS) operation, and may perform a black level correction (BLC) operation. The readout circuit 130 may be used to respectively read out a first analog signal (reference signal) and a second analog signal (sensing signal) of the pixel unit PD during a reset period and a readout period, and respectively convert them into a first digital number and a second digital number. The digital circuit 140 may subtract the second digital number from the first digital number to generate a sensing value. The digital circuit 140 may increase the second digital number through a voltage offset of the ramp signal, so as to increase the sensing value. Alternatively, the digital circuit 140 may reduce the second digital number through the voltage offset of the ramp signal, so as to reduce the sensing value. Alternatively, the digital circuit 140 may increase the first digital number through the voltage offset of the ramp signal, so as to decrease the sensing value. Alternatively, the digital circuit 140 may decrease the first digital number through the voltage offset of the ramp signal, so as to increase the sensed value. In addition, the offset of a counting value may also achieve an effect of black level correction (BLC).

In the embodiment, the digital circuit 140 may increase the first digital number and the second digital number at the same time through the voltage offset of the ramp signal, so that the sensing value is maintained (i.e., the sensing value remains unchanged). It should be noted that although the sensing value is maintained, a glitch (or spike) phenomenon of the photon transfer curve (PTC) may be greatly reduced, and ADC linearity may also be greatly improved. The digital circuit 140 may also simultaneously reduce the first digital number and the second digital number through the voltage offset of the ramp signal, so that the sensing value may be maintained. Similarly, although the sensing value is maintained, the glitch phenomenon of the photon transfer curve may be greatly reduced, and the ADC linearity may also be greatly improved.

In the embodiment, the pixel unit PD is coupled between a first terminal of the transfer transistor T3 and a ground terminal. A first terminal of the readout transistor T1 is coupled to an operating voltage VDD. A second terminal of the readout transistor T1 is coupled to a first terminal of the selection transistor T2. A control terminal of the readout transistor T1 is coupled to a floating diffusion node FD_P. The first terminal of the selection transistor T2 is coupled to the second terminal of the readout transistor T1. A second terminal of the selection transistor T2 is coupled to an output terminal Sout of the image sensor 100 for coupling to the readout circuit 130. A control terminal of the selection transistor T2 receives a selection signal SEL. A first terminal of the transfer transistor T3 is coupled to the pixel unit PD. A second terminal of the transfer transistor T3 is coupled to the floating diffusion node FD_P. A control terminal of the transfer transistor T3 receives a transfer signal TX. A first terminal of the reset transistor T4 is coupled to the operating voltage VDD. A second terminal of the reset transistor T4 is coupled to the floating diffusion node FD_P. A control terminal of the reset transistor T4 receives a reset signal RST. The ramp capacitor Cr is coupled between the floating diffusion node FD_P and the ramp signal generator 120.

In the embodiment, the pixel unit PD may be a photodiode. The readout transistor T1, the selection transistor T2, the transfer transistor T3 and the reset transistor T4 may be N-type transistors, but the disclosure is not limited thereto.

Referring to FIG. 1 and FIG. 2, in the embodiment, the ramp signal generator 120 may include a digital-to-analog converter (DAC), and the DAC may be a folded type DAC or a segment type DAC. In the embodiment, the photon transfer curve of the image sensor 100 may be as shown in FIG. 2. The image sensor 100 may perform a photon transfer test, so that the digital circuit 140 may generate the photon transfer curve as shown in FIG. 2 according to a plurality of sensing values generated during a continuous sensing period. In this regard, since the ramp signal generated by the ramp signal generator 120 may have the glitch (or spike) phenomenon at a boundary of a most significant bit (MSB) and a least significant bit (LSB) or at some bits, which results in signal distortion of the digital number of the sensing signal output by the digital circuit 140 at positions corresponding to certain specific photon numbers. In the embodiment, the ramp signal generator 120 may generate an offset to a voltage range or a counting result of the ramp signal, so as to achieve the effect of black level correction. Moreover, if the offset of the voltage range is changed frame by frame, specifically different frames, the readout circuit 130 may avoid the position where the ramp signal has the glitch phenomenon in the process of reading out the sensing result of the pixel unit PD, and the photon transfer curve of the image sensor 100 may be smoother, or occurrence of signal distortion may be reduced. In this regard, the ramp signal generator 120 may provide an offset voltage during at least one of the reset period or the readout period.

Figure 3:
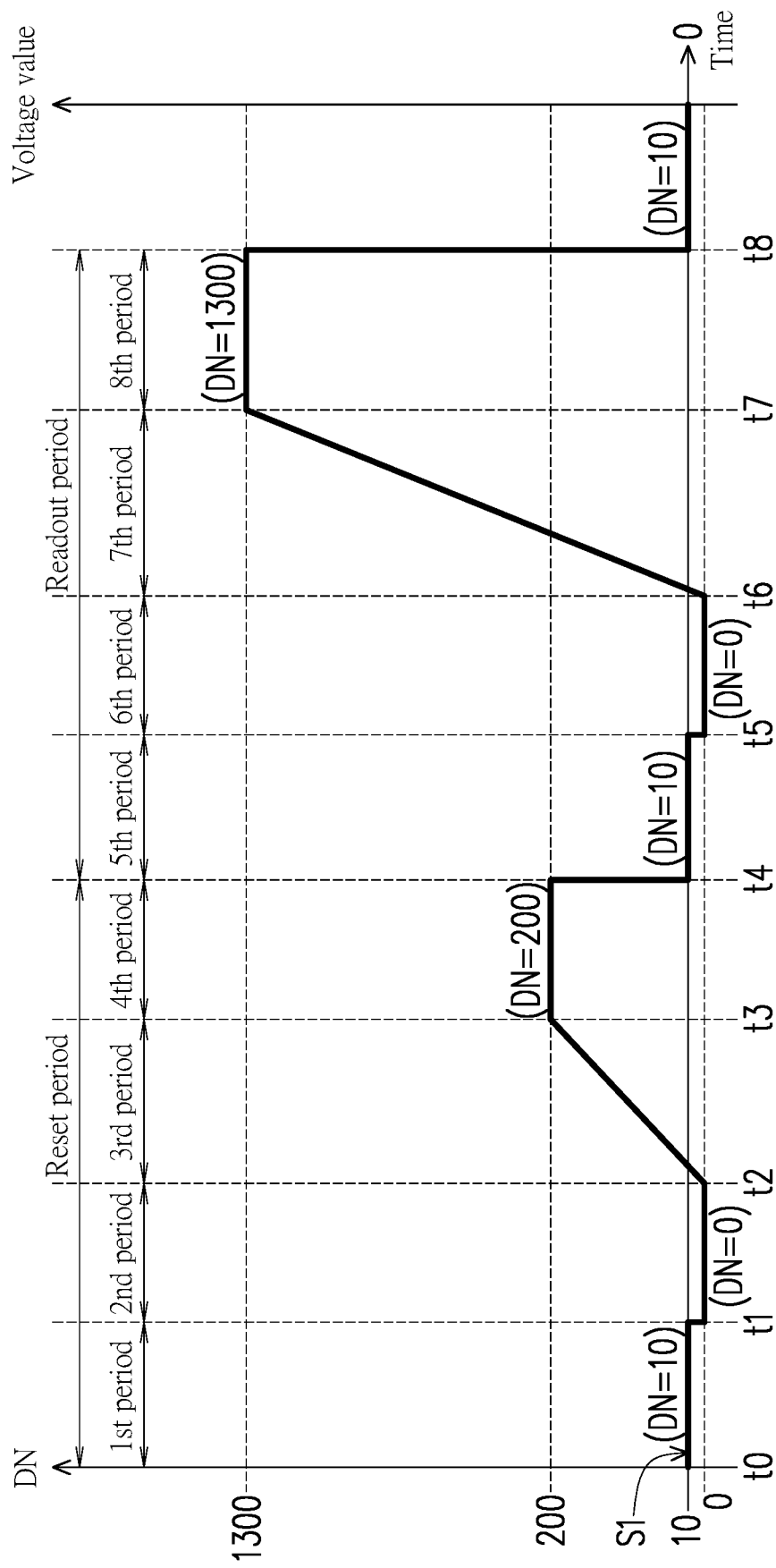
FIG. 3 is a schematic waveform diagram of a ramp signal according to an embodiment of the disclosure.

FIG. 3 is a schematic waveform diagram of a ramp signal according to an embodiment of the disclosure. Referring to FIG. 1 and FIG. 3, in the embodiment, the ramp signal generator 120 may generate a ramp signal S1 as shown in FIG. 3 when the BLC function is not enabled. The image sensor 100 of the disclosure may be a digital correlated double sampling (DDS) circuit, which performs sampling during the reset period and the readout (signal) period when the pixel circuit 110 is in operation, and performs subtraction in the digital circuit 140. It should be noted that the following offset voltage may be a signal difference value of any two periods. The readout period may be repeated as a following first period to a fourth period, and a first to third DC level voltages and the voltage value of the ramp signal during the reset period and the readout period may be different values, which may be as shown in FIG. 3 to FIG. 6.

Taking FIG. 3 as an example, time t0 to time t4 is the reset period, and time t4 to time t8 is the readout period. During the first period from time t0 to time t1, the digital circuit 140 may transmit a signal with a digital number not equal to 0 (the digital number is 10) to the ramp signal generator 120, so that the voltage of the ramp signal S1 has a preset offset (i.e., the following preset offset voltage), and may, for example, have a voltage value (a=0) corresponding to a digital number (DN) of 10 (DN=10), and the pixel circuit 110 receives the reset signal RST at the same time. During the second period from time t1 to time t2, the digital circuit 140 may transmit a signal with a digital number of 0 to the ramp signal generator 120, so that the voltage of the ramp signal S1 changes back to an initial value, which may, for example, have a voltage value (b=0) corresponding to the digital number of 0 (DN=0), and the change of the ramp signal S1 is coupled to the floating diffusion node FD_P through the ramp capacitor Cr, so that the voltage of the floating diffusion node FD_P has an offset. During the third period from time t2 to time t3, the signal transmitted from the digital circuit 140 to the ramp signal generator 120 is gradually increased from the digital number of 0 to 200, so that the voltages of the ramp signal S1 and the floating diffusion node FD_P are also gradually increased (or decreased). The readout transistor T1 may operate as a source follower during the period from time t2 to time t3 to read out a background signal of the floating diffusion node FD_P to the selection transistor T2, and output the background signal to the ramp-type ADC in the readout circuit 130 through the selection transistor T2, so as to convert the background signal to obtain the digital number of the signal, and since the voltage of the floating diffusion node FD_P has the offset, the readout digital number also has an offset. During the fourth period from time t3 to time t4, the ramp signal S1 may, for example, maintain a voltage value (c=200) corresponding to the digital number of 200 (DN=200).

During the fifth period from time t4 to time t5, the digital circuit 140 may transmit a signal with a digital number not equal to 0 (the digital number is 10) to the ramp signal generator 120, so that the voltage of the ramp signal S1 has the preset offset, and may, for example, have a voltage value (A=10) corresponding to the digital number of 10 (DN=10). During the sixth period from time t5 to time t6, the digital circuit 140 may transmit a signal with the digital number of 0 to the ramp signal generator 120, so that the voltage of the ramp signal S1 changes back to the initial value, which may, for example, have a voltage value (B=0) corresponding to the digital number of 0 (DN=0), and the change of the ramp signal S1 is coupled to the floating diffusion node FD_P through the ramp capacitor Cr, so that the voltage of the floating diffusion node FD_P has an offset. During the seventh period from time t6 to time t7, the signal transmitted from the digital circuit 140 to the ramp signal generator 120 is gradually increased from the digital number of 0 to 1300, so that the voltages of the ramp signal S1 and the floating diffusion node FD_P are also gradually increased (or decreased). The readout transistor T1 may operate as a source follower during the period from time t6 to time t7 to read out a sensing signal of the floating diffusion node FD_P to the selection transistor T2, and output the sensing signal to the ramp-type ADC in the readout circuit 130 through the selection transistor T2, so as to convert the sensing signal to obtain the digital number of the signal, and since the voltage of the floating diffusion node FD_P has the offset, the readout digital number also has an offset. During the eighth period from time t7 to time t8, the ramp signal S1 may, for example, maintain a voltage value (c=1300) corresponding to the digital number of 1300 (DN=1300). After the time t8, the ramp signal S1 may have, for example, the voltage value corresponding to the digital number of 10 (DN=10).

Therefore, the digital circuit 140 may subtract the digital number of the background signal from the digital number of the sensing signal to obtain a sensing result with background noise removed. In the embodiment, since the offset voltages of the ramp signal in the second period of the reset period and the sixth period of the readout period are equal to each other (a=A=10), the sensing result obtained after subtraction is the sensing result without the black level correction (BLC) effect.

Figure 4:
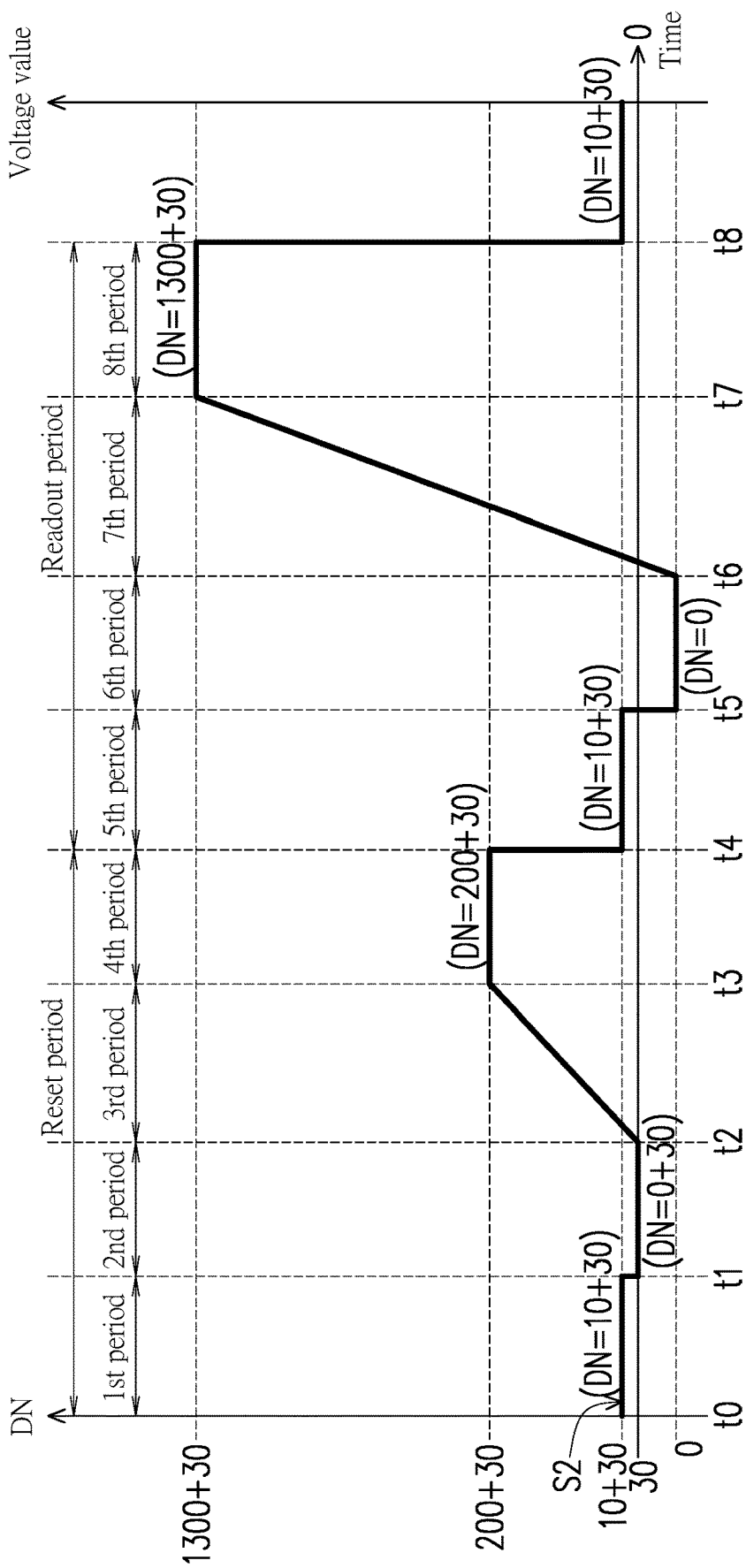
FIG. 4 is a schematic waveform diagram of a ramp signal according to an embodiment of the disclosure.

FIG. 4 is a schematic waveform diagram of a ramp signal according to an embodiment of the disclosure. Referring to FIG. 1 and FIG. 4, when the black level correction (BLC) function is enabled, the ramp signal generator 120 may generate a ramp signal S2 as shown in FIG. 4. In the embodiment, the ramp signal generator 120 may further shift the lowest voltage value and the highest voltage value of the ramp signal S2 during the reset period and the highest voltage value during the readout period according to the (additional) offset voltage. In the embodiment, the offset voltage may, for example, correspond to a digital number j=30, and j is a constant value, but the disclosure is not limited thereto. In other embodiments, the offset voltage may also correspond to other digital numbers.

During the first period from time t0 to time t1, the digital circuit 140 may transmit a signal with a digital number equal to 40 to the ramp signal generator 120, so that the voltage of the ramp signal S2 has an offset (i.e., a preset offset voltage corresponding to a digit number of 10 plus an (additional) offset voltage corresponding to a digit number of 30), and may, for example, have a voltage value (a=40) corresponding to the digital number (DN) of 40 (DN=10+j=10+30), and the pixel circuit 110 receives the reset signal RST at the same time. During the second period from time t1 to time t2, the digital circuit 140 may transmit a signal with the digital number of 30 to the ramp signal generator 120, so that the ramp signal S2 may, for example, have a voltage value (b=30) corresponding to the digital number of 30 (DN=0+j=0+30), and the change of the ramp signal S1 is coupled to the floating diffusion node FD_P through the ramp capacitor Cr, so that the voltage of the floating diffusion node FD_P has an offset. During the third period from time t2 to time t3, the signal transmitted from the digital circuit 140 to the ramp signal generator 120 is gradually increased from the digital number of 30 to 230, so that the voltages of the ramp signal S1 and the floating diffusion node FD_P are also gradually increased (or decreased). The readout transistor T1 may operate as a source follower during the period from time t2 to time t3 to read out a background signal of the floating diffusion node FD_P to the selection transistor T2, and output the background signal to the ramp-type ADC in the readout circuit 130 through the selection transistor T2, so as to convert the background signal to obtain the digital number of the signal, and since the voltage of the floating diffusion node FD_P has the offset, the readout digital number also has an offset. During the fourth period from time t3 to time t4, the ramp signal S2 may, for example, maintain a voltage value (c=230) corresponding to the digital number of 230 (DN=200+j=200+30).

During the fifth period from time t4 to time t5, the digital circuit 140 may transmit a signal with a digital number of 40 to the ramp signal generator 120, so that the voltage of the ramp signal S2 has an offset (i.e., a preset offset voltage corresponding to the digit number of 10 plus an offset voltage corresponding to the digit number of 30), and may, for example, have a voltage value (A=40) corresponding to the digital number of 40 (DN=10+j=10+30). During the sixth period from time t5 to time t6, the digital circuit 140 may transmit a signal with the digital number of 0 to the ramp signal generator 120 (i.e. no voltage offset), so that the voltage of the ramp signal S2 changes back to the initial value, which may, for example, have a voltage value (B=0) corresponding to the digital number of 0 (DN=0). During the seventh period from time t6 to time t7, the signal transmitted from the digital circuit 140 to the ramp signal generator 120 is gradually increased from the digital number of 0 to 1330, so that the voltages of the ramp signal S1 and the floating diffusion node FD_P are also gradually increased (or decreased). The readout transistor T1 may operate as a source follower during the period from time t6 to time t7 to read out a sensing signal of the floating diffusion node FD_P to the selection transistor T2, and output the sensing signal to the ramp-type ADC in the readout circuit 130 through the selection transistor T2, so as to convert the sensing signal to obtain the digital number of the signal, and since the voltage of the floating diffusion node FD_P has the offset, the readout digital number also has an offset. During the eighth period from time t7 to time t8, the ramp signal S2 may, for example, maintain a voltage value (c=1300) corresponding to the digital number of 1330 (DN=1300+j=1300+30). After the time t8, the ramp signal S2 may have, for example, the voltage value corresponding to the digital number of 40 (DN=10+j=10+30).

Therefore, the digital circuit 140 may subtract the digital number of the background signal from the digital number of the sensing signal to obtain a sensing result with background noise removed. Moreover, since the offset voltage of the ramp signal during the reset period is not equal to that during the readout period (the offset voltage during the readout period (A−B=40−0=40) is higher compared to the offset voltage during the reset period (a−b=40−30=10)), compared to the embodiment in FIG. 3, the sensing result obtained after the subtraction is increased, so as to achieve the sensing result with the black level correction (BLC) effect. In this regard, the digital circuit 140 may include a ramp signal controller 841 shown in FIG. 8, and the ramp signal controller 841 may additionally generate an offset voltage by controlling the ramp signal generator 120, so that a voltage range or a counting result of the pixel circuit 110 during at least one of the reset period and the readout period has an additional offset.

Figure 5:
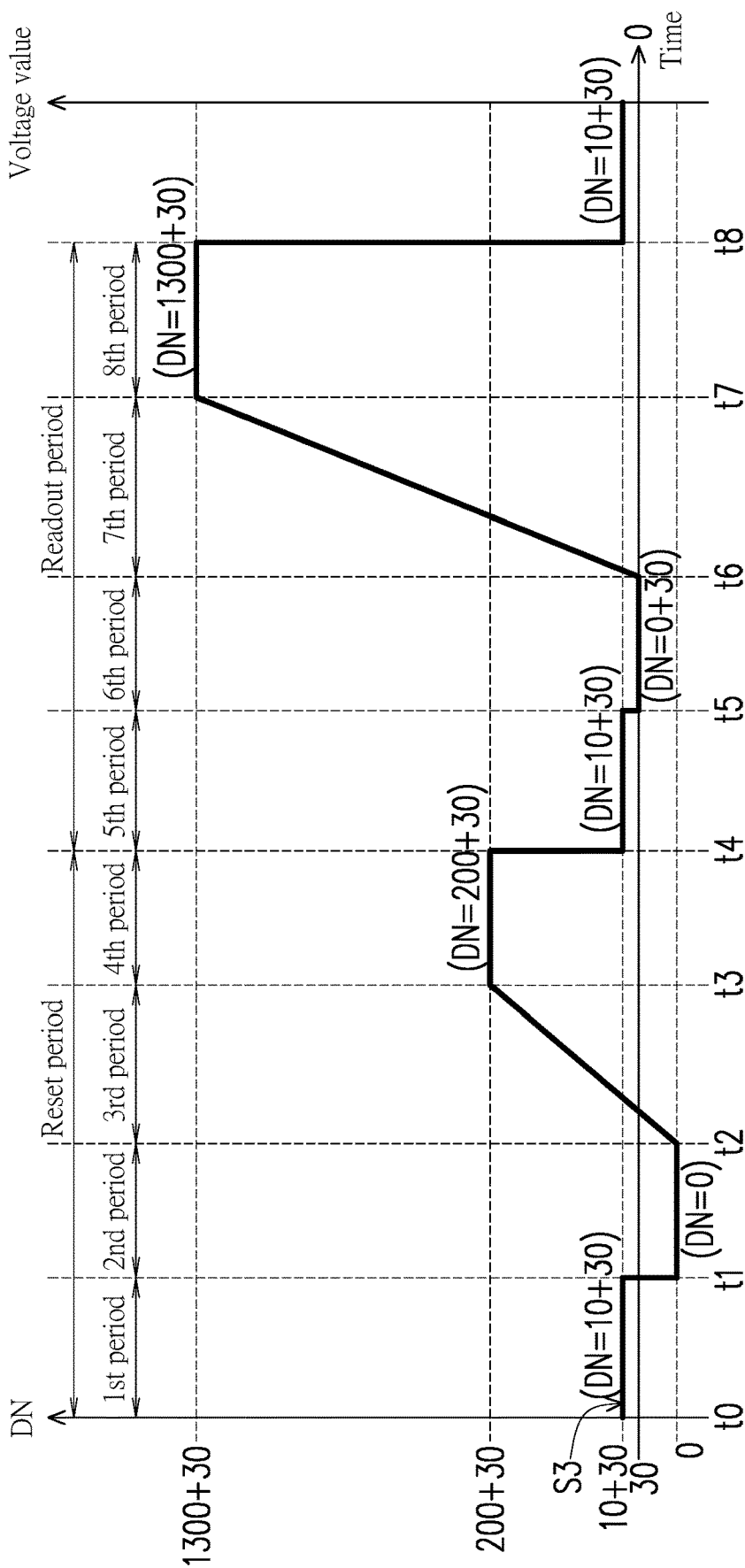
FIG. 5 is a schematic waveform diagram of a ramp signal according to an embodiment of the disclosure.

FIG. 5 is a schematic waveform diagram of a ramp signal according to an embodiment of the disclosure. Referring to FIG. 1 and FIG. 5, when the black level correction (BLC) function is enabled, the ramp signal generator 120 may generate a ramp signal S3 as shown in FIG. 5. In the embodiment, the ramp signal generator 120 may further shift the highest voltage value of the ramp signal S3 during the reset period and the lowest voltage value and the highest voltage value during the readout period according to the (additional) offset voltage. In the embodiment, the offset voltage may, for example, correspond to a digital number j=30, and j is a constant value, but the disclosure is not limited thereto. In other embodiments, the offset voltage may also correspond to other digital numbers. During the first period from time t0 to time t1, the digital circuit 140 may transmit a signal with a digital number equal to 40 to the ramp signal generator 120, so that the voltage of the ramp signal S3 has an offset (i.e., a preset offset voltage corresponding to the digit number of 10 plus an (additional) offset voltage corresponding to the digit number of 30), and may, for example, have a voltage value (a=40) corresponding to the digital number (DN) of 40 (DN=10+j=10+30), and the pixel circuit 110 receives the reset signal RST at the same time. During the second period from time t1 to time t2, the digital circuit 140 may transmit a signal with the digital number of 0 to the ramp signal generator 120 (i.e. no voltage offset), so that the ramp signal S3 may, for example, have a voltage value (b=0) corresponding to the digital number of 0 (DN=0), and the change of the ramp signal S1 is coupled to the floating diffusion node FD_P through the ramp capacitor Cr, so that the voltage of the floating diffusion node FD_P has an offset. During the third period from time t2 to time t3, the signal transmitted from the digital circuit 140 to the ramp signal generator 120 is gradually increased from the digital number of 0 to 230, so that the voltages of the ramp signal S1 and the floating diffusion node FD_P are also gradually increased (or decreased). The readout transistor T1 may operate as a source follower during the period from time t2 to time t3 to read out a background signal of the floating diffusion node FD_P to the selection transistor T2, and output the background signal to the ramp-type ADC in the readout circuit 130 through the selection transistor T2, so as to convert the background signal to obtain the digital number of the signal. During the fourth period from time t3 to time t4, the ramp signal S3 may, for example, maintain a voltage value (c=230) corresponding to the digital number of 230 (DN=200+j=200+30).

During the fifth period from time t4 to time t5, the digital circuit 140 may transmit a signal with a digital number of 40 to the ramp signal generator 120, so that the voltage of the ramp signal S3 has an offset (i.e., a preset offset voltage corresponding to the digit number of 10 plus an offset voltage corresponding to the digit number of 30), and may, for example, have a voltage value (A=40) corresponding to the digital number of 40 (DN=10+j=10+30). During the sixth period from time t5 to time t6, the digital circuit 140 may transmit a signal with the digital number of 0 to the ramp signal generator 120 (i.e. no voltage offset), so that the voltage of the ramp signal S3 changes back to another initial value, which may, for example, have a voltage value (B=30) corresponding to the digital number of 30 (DN=0+j=0+30), and the change of the ramp signal S3 is coupled to the floating diffusion node FD_P through the ramp capacitor Cr, so that the voltage of the floating diffusion node FD_P has an offset. During the seventh period from time t6 to time t7, the signal transmitted from the digital circuit 140 to the ramp signal generator 120 is gradually increased from the digital number of 30 to 1330, so that the voltages of the ramp signal S1 and the floating diffusion node FD_P are also gradually increased (or decreased). The readout transistor T1 may operate as a source follower during the period from time t6 to time t7 to read out a sensing signal of the floating diffusion node FD_P to the selection transistor T2, and output the sensing signal to the ramp-type ADC in the readout circuit 130 through the selection transistor T2, so as to convert the sensing signal to obtain the digital number of the signal, and since the voltage of the floating diffusion node FD_P has the offset, the readout digital number also has an offset. During the eighth period from time t7 to time t8, the ramp signal S3 may, for example, maintain a voltage value (c=40) corresponding to the digital number of 1330 (DN=1300+j=1300+30). After the time t8, the ramp signal S3 may have, for example, the voltage value corresponding to the digital number of 40 (DN=10+j=10+30).

Therefore, the digital circuit 140 may subtract the digital number of the background signal from the digital number of the sensing signal to obtain a sensing result with background noise removed. Moreover, since the offset voltage of the ramp signal during the reset period is not equal to that during the readout period (the offset voltage during the reset period (a−b=40−0=40) is higher compared to the offset voltage during the sensing period (A−B=40−30=10)), compared to the embodiment in FIG. 3, the sensing result obtained after the subtraction is decreased, so as to achieve the sensing result with the black level correction (BLC) effect. In this regard, the digital circuit 140 may include the ramp signal controller 841 shown in FIG. 8, and the ramp signal controller 841 may additionally generate an offset voltage by controlling the ramp signal generator 120, so that a voltage range or a counting result of the pixel circuit 110 during at least one of the reset period and the readout period has an additional offset.

Figure 6:
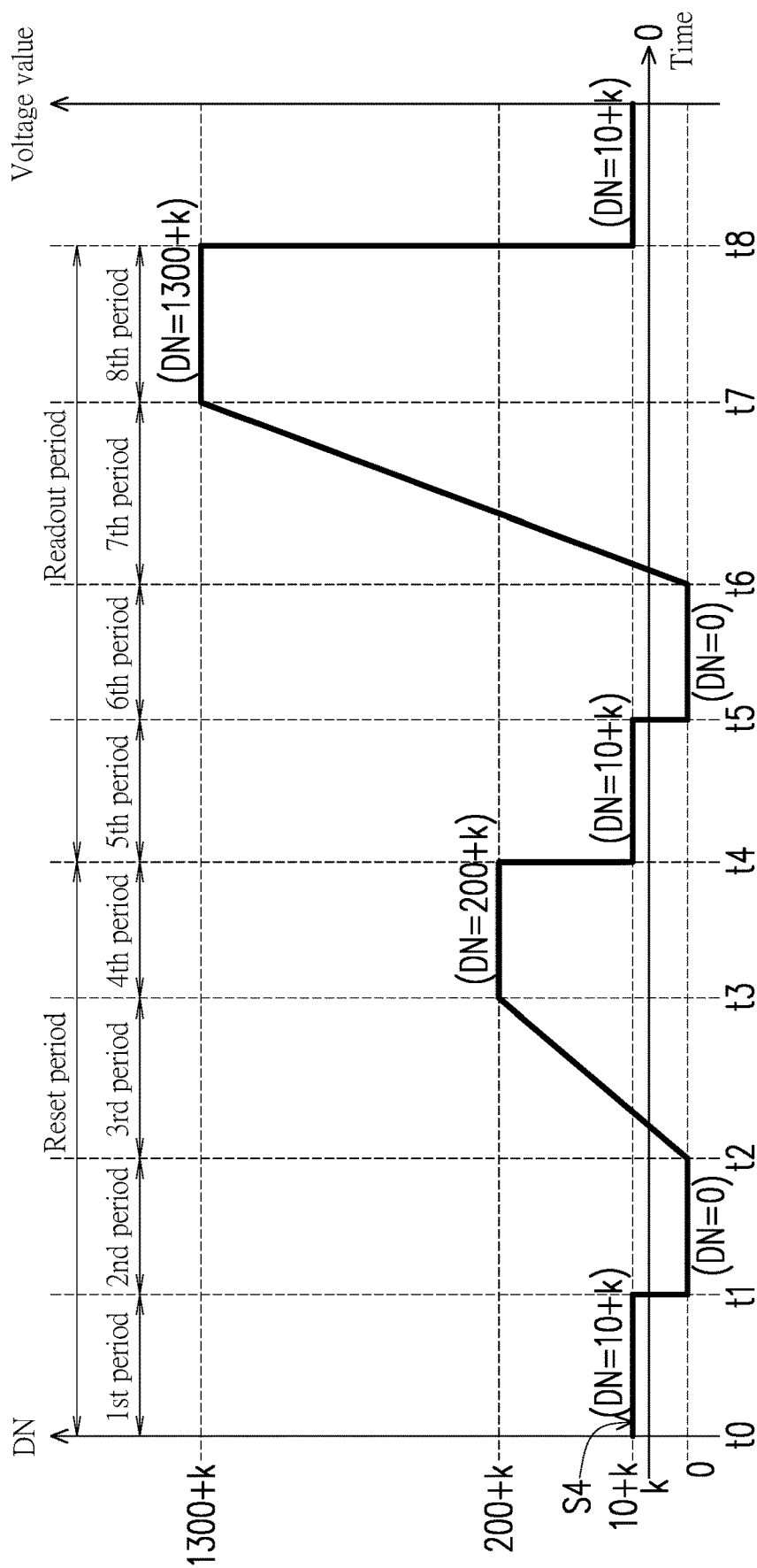
FIG. 6 is a schematic waveform diagram of a ramp signal according to an embodiment of the disclosure.

FIG. 6 is a schematic waveform diagram of a ramp signal according to an embodiment of the disclosure. Referring to FIG. 1 and FIG. 6, when the black level correction (BLC) function is not enabled, the ramp signal generator 120 may generate a ramp signal S4 as shown in FIG. 6. In the embodiment, the ramp signal generator 120 may shift the voltage value of the ramp signal S4 during the reset period and the voltage value during the readout period according to the offset voltage, so that the counting result has an offset. In the embodiment, the offset voltage may, for example, correspond to a digital number k. In an embodiment, the offset voltage may be a variable value that changes frame by frame. Furthermore, in a configuration where the pixel circuits 110 of the image sensor 100 are arranged in an array (i.e., a pixel array), the offset voltage may also be a variable value that changes row by row and frame by frame. It should be noted that when the offset voltage changes row by row, the values of the same row in different frames are also different. In detail, the offset voltage in FIG. 3 is a voltage difference value corresponding to the digital number of 10, and the offset voltage in FIG. 6 is a voltage difference value corresponding to a digital number of 10+k. The digital number k may be generated, for example, based on a regular triangular wave or a random number, which may be, for example, a pseudorandom binary sequence (PRBS).

During the first period from time t0 to time t1, the digital circuit 140 may transmit a signal with a digital number equal to 10+k to the ramp signal generator 120, so that the voltage of the ramp signal S4 has an offset (i.e., a preset offset voltage corresponding to the digit number of plus an (additional) offset voltage corresponding to the digit number of k), and may, for example, have a voltage value (a=10+k) corresponding to the digital number (DN) of 10+k (DN=10+k), and the pixel circuit 110 may receive the reset signal RST at the same time. During the second period from time t1 to time t2, the digital circuit 140 may transmit a signal with the digital number of 0 to the ramp signal generator 120 (i.e. no voltage offset), so that the ramp signal S4 may, for example, have a voltage value corresponding to the digital number of 0 (DN=0), and the change of the ramp signal S1 is coupled to the floating diffusion node FD_P through the ramp capacitor Cr, so that the voltage of the floating diffusion node FD_P has an offset. During the third period from time t2 to time t3, the signal transmitted from the digital circuit 140 to the ramp signal generator 120 is gradually increased from the digital number of 0 to 200+k, so that the voltages of the ramp signal S1 and the floating diffusion node FD_P are also gradually increased (or decreased). The readout transistor T1 may operate as a source follower during the period from time t2 to time t3 to read out a background signal of the floating diffusion node FD_P to the selection transistor T2, and output the background signal to the ramp-type ADC in the readout circuit 130 through the selection transistor T2, so as to convert the background signal to obtain the digital number of the signal. Since the voltage of FD_P has the offset, the readout digital number also has an offset. During the fourth period from time t3 to time t4, the ramp signal S4 may, for example, maintain a voltage value (c=200+k) corresponding to the digital number of 200+k (DN=200+k).

During the fifth period from time t4 to time t5, the digital circuit 140 may transmit a signal with the digital number of 10+k to the ramp signal generator 120, so that the voltage of the ramp signal S4 has an offset (i.e., a preset offset voltage corresponding to the digit number of 10 plus an offset voltage corresponding to the digit number of k), and the ramp signal S4 may, for example, have a voltage value (A=10+k) corresponding to the digital number of 10+k (DN=10+k). During the sixth period from time t5 to time t6, the digital circuit 140 may transmit a signal with the digital number of 0 to the ramp signal generator 120 (i.e. no voltage offset), so that the voltage of the ramp signal S4 changes back to the initial value, which may, for example, have a voltage value corresponding to the digital number of 0 (DN=0), and the change of the ramp signal S3 is coupled to the floating diffusion node FD_P through the ramp capacitor Cr, so that the voltage of the floating diffusion node FD_P has an offset. During the seventh period from time t6 to time t7, the signal transmitted from the digital circuit 140 to the ramp signal generator 120 is gradually increased from the digital number of 0 to 1300+k, so that the voltages of the ramp signal S1 and the floating diffusion node FD_P are also gradually increased (or decreased). The readout transistor T1 may operate as a source follower during the period from time t6 to time t7 to read out a sensing signal of the floating diffusion node FD_P to the selection transistor T2, and output the sensing signal to the ramp-type ADC in the readout circuit 130 through the selection transistor T2, so as to convert the sensing signal to obtain the digital number of the signal, and since the voltage of the floating diffusion node FD_P has the offset, the readout digital number also has an offset. During the eighth period from time t7 to time t8, the ramp signal S4 may, for example, maintain a voltage value (c=1300+k) corresponding to the digital number of 1300+k (DN=1300+k). After the time t8, the ramp signal S4 may have, for example, the voltage value corresponding to the digital number of 10+k (DN=10+k).

Therefore, the digital circuit 140 may subtract the digital number of the background signal from the digital number of the sensing signal to obtain a sensing result with background noise removed. Since the digital number k of the embodiment may change frame by frame or frame by frame and row by row, which makes an offset voltage of the voltage range (or counting result) of the ramp signal S4 during the reset period and the readout period in different frames to be a non-constant voltage value, certain specific digital numbers of the plurality of sensing results of the pixel unit PD readout by the readout circuit 130 in a plurality of consecutive frames may effectively avoid the positions where the ramp signal S4 has a glitch, and the photon transfer curve of the image sensor 100 may become smoother or occurrence of signal distortion may be reduced. The image sensor 100 of the disclosure is a digital correlated double sampling (DDS) circuit, which performs sampling during the reset period and the readout period when the pixel circuit 110 is in operation, performs subtraction in the digital circuit 140. Since the (additional) offset voltage corresponding to the digital number k is added during the reset period and the readout period, regardless of how the digital number k changes, the difference between the reset period and the readout period is the same, so that the final digital number of the sensing result obtained through sensing is not changed, i.e., the sensing result will not be distorted. On the other hand, it is also possible to add the (additional) offset voltage corresponding to the digital number k only during the readout period, and then the digital circuit 140 subtracts the same k value from the output digital number, so that the final digital number of the sensing result obtained through sensing is also not changed.

Figure 7A:
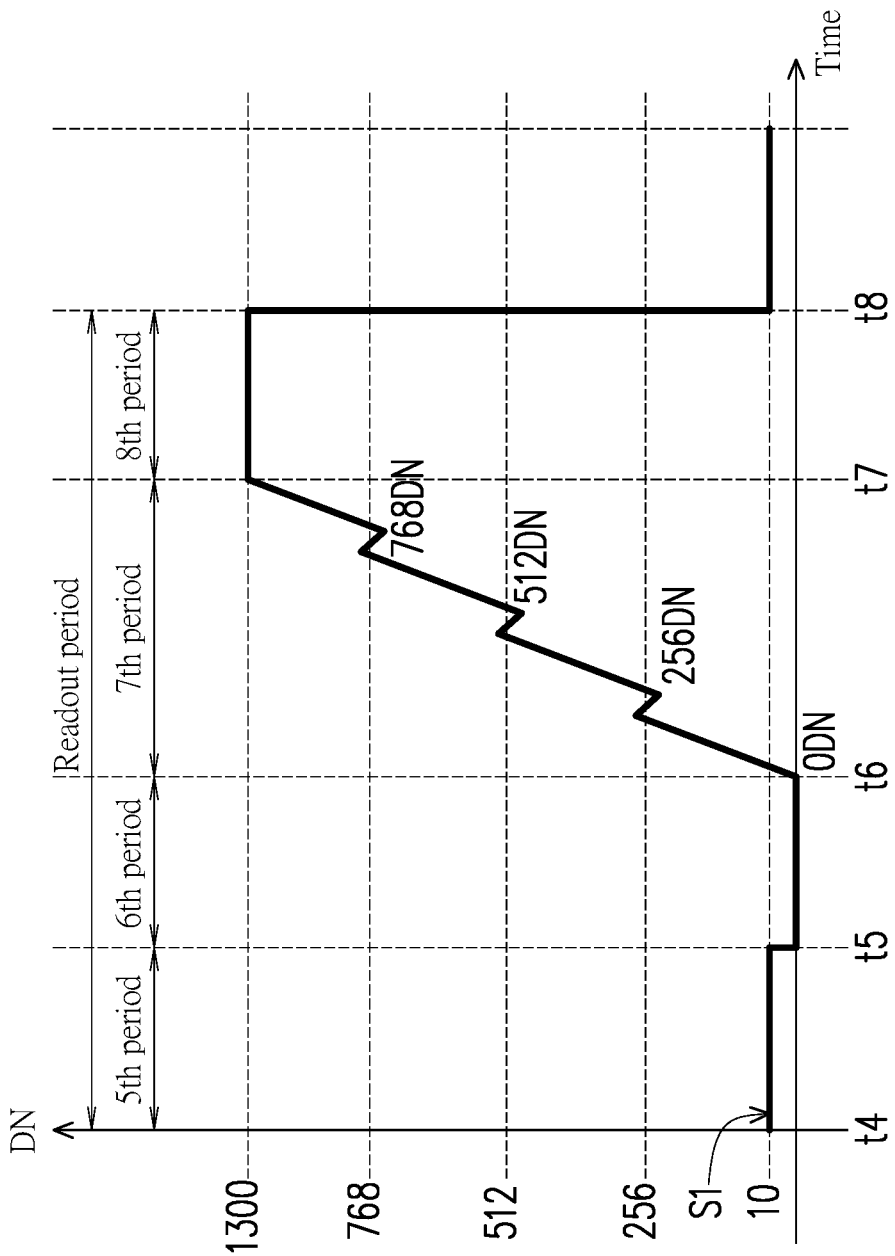
FIG. 7A is a schematic waveform diagram of a ramp signal according to an embodiment of the disclosure.

FIG. 7A is a schematic waveform diagram of a ramp signal according to an embodiment of the disclosure. Referring to FIG. 1, FIG. 3 and FIG. 7A, taking the embodiment of FIG. 3 as an example, in the case that the ramp signal generator 120 does not shift the voltage range or the counting result of the ramp signal, the ramp signal generator 120 may generate the ramp signal S1 as shown in FIG. 7A. In the embodiment, the ramp signal S1 may, for example, have glitches at positions corresponding to digital numbers 256, 512, and 768 during the seventh period from time t6 to time t7. In this way, in a plurality of sensing images continuously generated by the image sensor 100, the pixel values of the sensing results (readout results) respectively corresponding to digital numbers of 256, 512, and 768 will always be the result of sensing distortion.

Figure 7B:
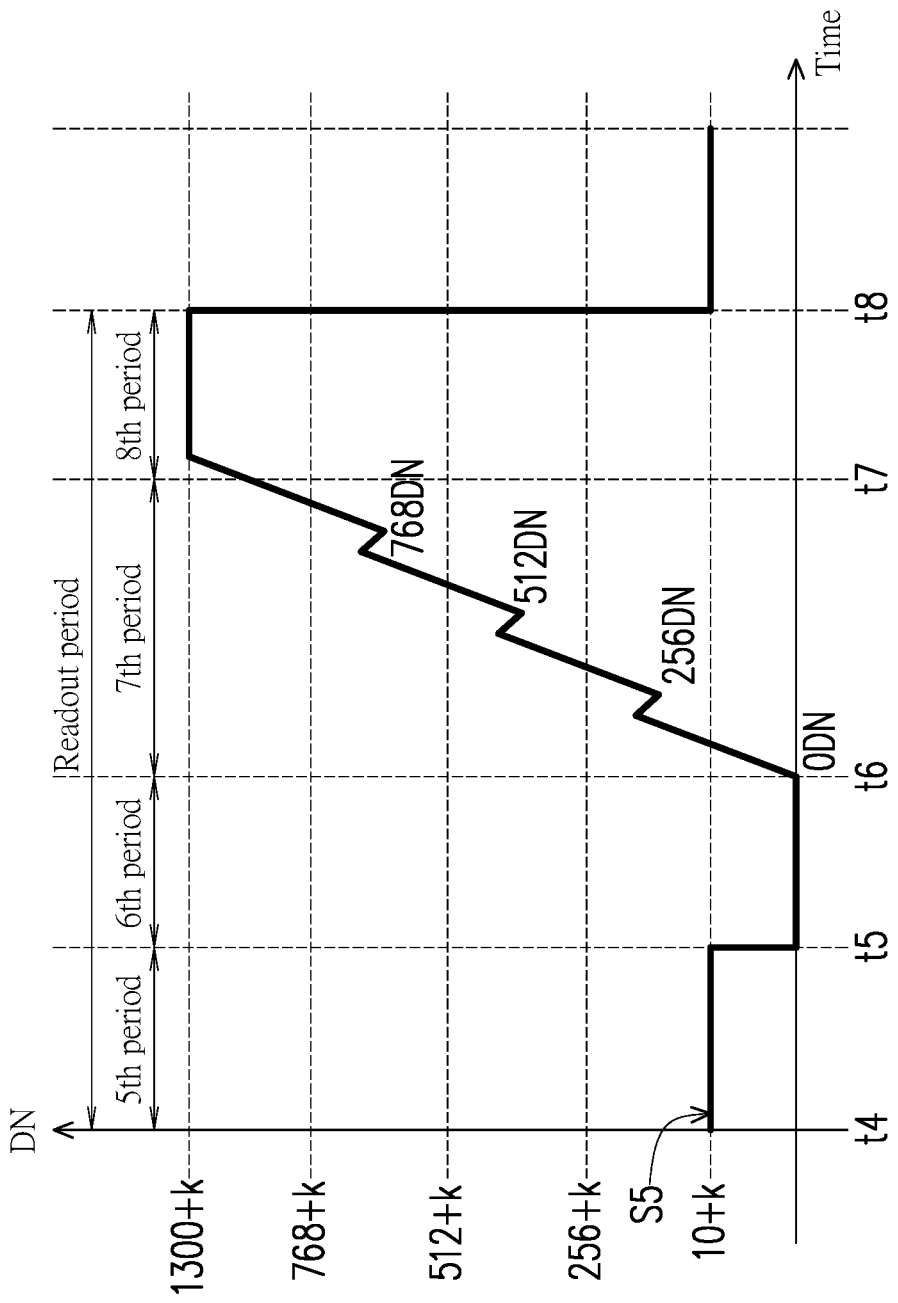
FIG. 7B is a schematic waveform diagram of a ramp signal according to an embodiment of the disclosure.

FIG. 7B is a schematic waveform diagram of a ramp signal according to an embodiment of the disclosure. Referring to FIG. 1, FIG. 6 and FIG. 7B, taking the embodiment of FIG. 6 as an example, in the case that the ramp signal generator 120 shifts the voltage range or the counting result of the ramp signal, the ramp signal generator 120 may generate a ramp signal S5 as shown in FIG. 7B. In the embodiment, although the ramp signal S5 still has glitches at the positions corresponding to the digital numbers of 256, 512, and 768, the sensing signals originally corresponding to the digital numbers of 256, 512, and 768 will be shifted to 256+k, 512+k, 768+k to avoid the positions where the glitch occurs. In this way, in the plurality of sensing images continuously generated by the image sensor 100, as long as the k value changes frame by frame, or changes column by column and frame by frame, the image sensor 100 is not liable to continuously sense distortion results at the pixel values of the sensing results (readout results) corresponding to certain specific digital numbers.

Moreover, the image sensor 100 of the disclosure is a digital correlated double sampling (DDS) circuit, and performs sampling during the reset period and the readout period when the pixel circuit 110 is in operation, and performs subtraction in the digital circuit 140. Since the (additional) offset voltage corresponding to the digital number k is added during the reset period and the readout period, regardless of how the digital number k changes, the difference between the reset period and the readout period is the same, so that the final digital number of the sensing result obtained through sensing is not changed, i.e., the sensing result will not be distorted. On the other hand, it is also possible to add the (additional) offset voltage corresponding to the digital number k only during the readout period, and then the digital circuit 140 subtracts the same k value from the output digital number, so that the final digital number of the sensing result obtained through sensing is also not changed.

Figure 8:
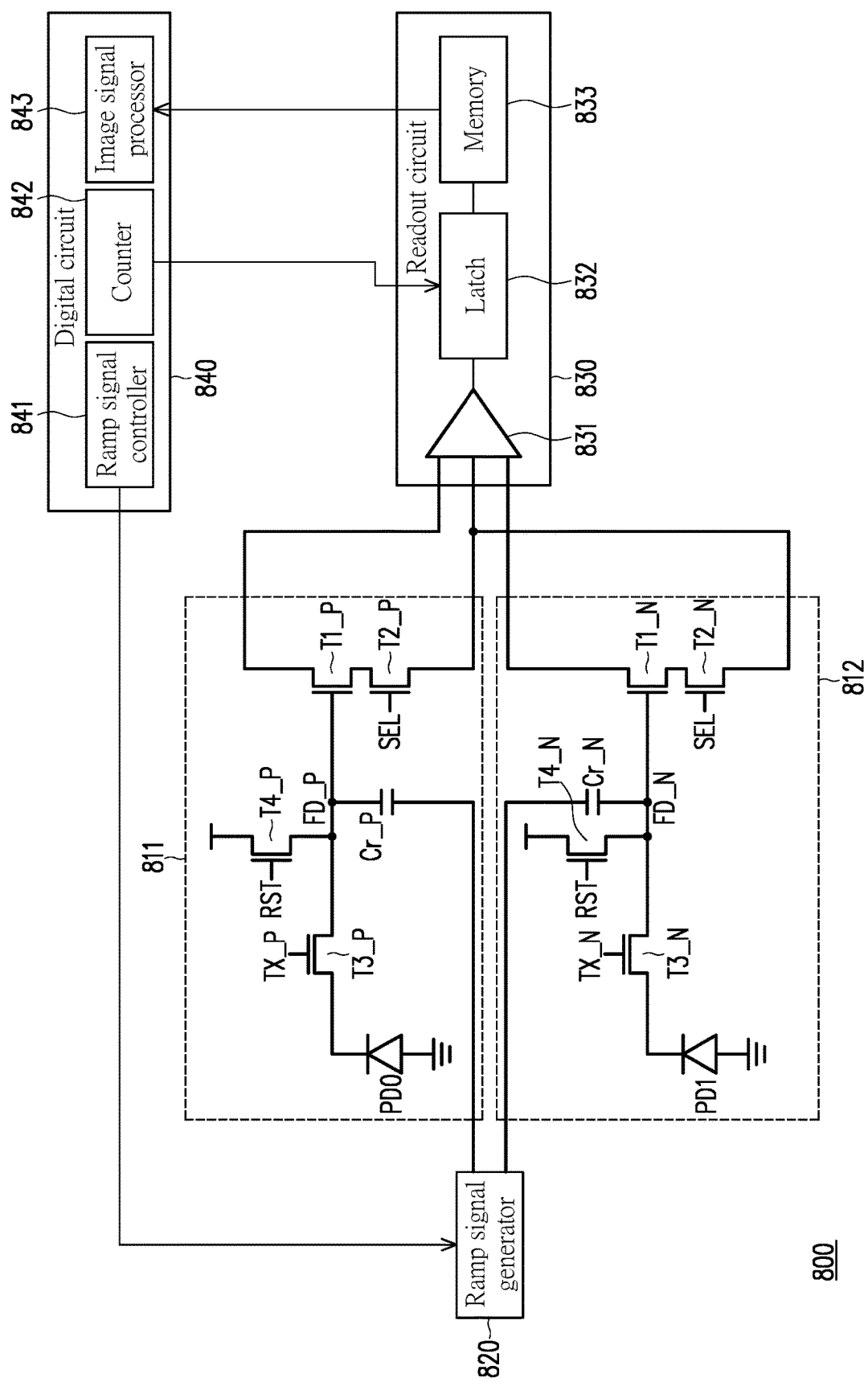
FIG. 8 is a schematic circuit diagram of an image sensor according to another embodiment of the disclosure.

FIG. 8 is a schematic circuit diagram of an image sensor according to another embodiment of the disclosure. Referring to FIG. 8, an image sensor 800 includes a first pixel circuit 811, a second pixel circuit 812, a ramp signal generator 820, a readout circuit 830 and a digital circuit 840. The first pixel circuit 811 includes a first pixel unit PD0, a first readout transistor T1_P, a first selection transistor T2_P, a first transfer transistor T3_P, a first reset transistor T4_P and a first ramp capacitor Cr_P. The second pixel circuit 812 includes a second pixel unit PD1, a second readout transistor T1_N, a second selection transistor T2_N, a second transfer transistor T3_N, a second reset transistor T4_N and a second ramp capacitor Cr_N. In the embodiment, the readout circuit 830 may include a differential amplifier 831 (i.e., a comparator), a latch 832, and a memory (for example, a static random access memory (SRAM)) 833. The digital circuit 840 may include a ramp signal controller 841, a counter 842 and an image signal processor 843. The first pixel circuit 811 may be coupled to a first input terminal of the differential amplifier 831. The second pixel circuit 812 may be coupled to a second input terminal of the differential amplifier 831. An output terminal of the differential amplifier 831 may generate an output voltage.

The first pixel circuit 811 and the second pixel circuit 812 are coupled to the ramp signal generator 820 and the readout circuit 830, and the readout circuit 830 is coupled to the digital circuit 840. In the embodiment, the ramp signal controller 841 of the digital circuit 840 may control the ramp signal generator 820, so that the ramp signal generator 820 may provide a first ramp signal and a second ramp signal to the first pixel circuit 811 and the second pixel circuit 812, and the differential amplifier 831 of the readout circuit 830 may read out sensing results of the first pixel unit PD0 and the second pixel unit PD1 through the first pixel circuit 811 and the second pixel circuit 812 in collaboration with the first ramp signal and the second ramp signal, and store the sensing results in the latch 832. When the sensing result changes, the latch 832 may use a counting value of a counting signal provided by the counter 842 as a corresponding digital number, and record the digital number in the memory 833, and then the memory 833 provides the digital number to the image signal processor 843 of the digital circuit 840 for further calculation.

In the embodiment, the first pixel unit PD0 is coupled between a first terminal of the first transfer transistor T3_P and a ground terminal. A first terminal of the first readout transistor T1_P is coupled to the first input terminal of the differential amplifier 831. A second terminal of the first readout transistor T1_P is coupled to a first terminal of the first selection transistor T2_P. A control terminal of the first readout transistor T1_P is coupled to the first floating diffusion node FD_P. The first terminal of the first selection transistor T2_P is coupled to the second terminal of the first readout transistor T1_P. A second terminal of the first selection transistor T2_P is coupled to a current source of the differential amplifier 831. A control terminal of the first selection transistor T2_P receives a selection signal SEL. The first terminal of the first transfer transistor T3_P is coupled to the first pixel unit PD0. A second terminal of the first transfer transistor T3_P is coupled to the first floating diffusion node FD_P. A control terminal of the first transfer transistor T3_P receives a first transfer signal TX_P. A first terminal of the first reset transistor T4_P is coupled to the operating voltage VDD. A second terminal of the first reset transistor T4_P is coupled to the first floating diffusion node FD_P. A control terminal of the first reset transistor T4_P receives a reset signal RST. The first ramp capacitor Cr_P is coupled between the first floating diffusion node FD_P and the ramp signal generator 820.

The second pixel unit PD1 is coupled between a first terminal of the second transfer transistor T3_N and the ground terminal. A first terminal of the second readout transistor T1_N is coupled to the second input terminal of the differential amplifier 831. A second terminal of the second readout transistor T1_N is coupled to a first terminal of the second selection transistor T2_N. A control terminal of the second readout transistor T1_N is coupled to a second floating diffusion node FD_N. The first terminal of the second selection transistor T2_N is coupled to the second terminal of the second readout transistor T1_N. A second terminal of the second selection transistor T2_N and the second terminal of the first selection transistor T2_P are jointly coupled to the current source of the differential amplifier 831. A control terminal of the second selection transistor T2_N receives the selection signal SEL. The first terminal of the second transfer transistor T3_N is coupled to the second pixel unit PD1. A second terminal of the second transfer transistor T3_N is coupled to the second floating diffusion node FD_N. A control terminal of the second transfer transistor T3_N receives a second transfer signal TX_N. A first terminal of the second reset transistor T4_N is coupled to the operating voltage VDD. A second terminal of the second reset transistor T4_N is coupled to the second floating diffusion node FD_N. A control terminal of the second reset transistor T4_N receives the reset signal RST. The second ramp capacitor Cr_N is coupled between the second floating diffusion node FD_N and the ramp signal generator 820.

Figure 9:
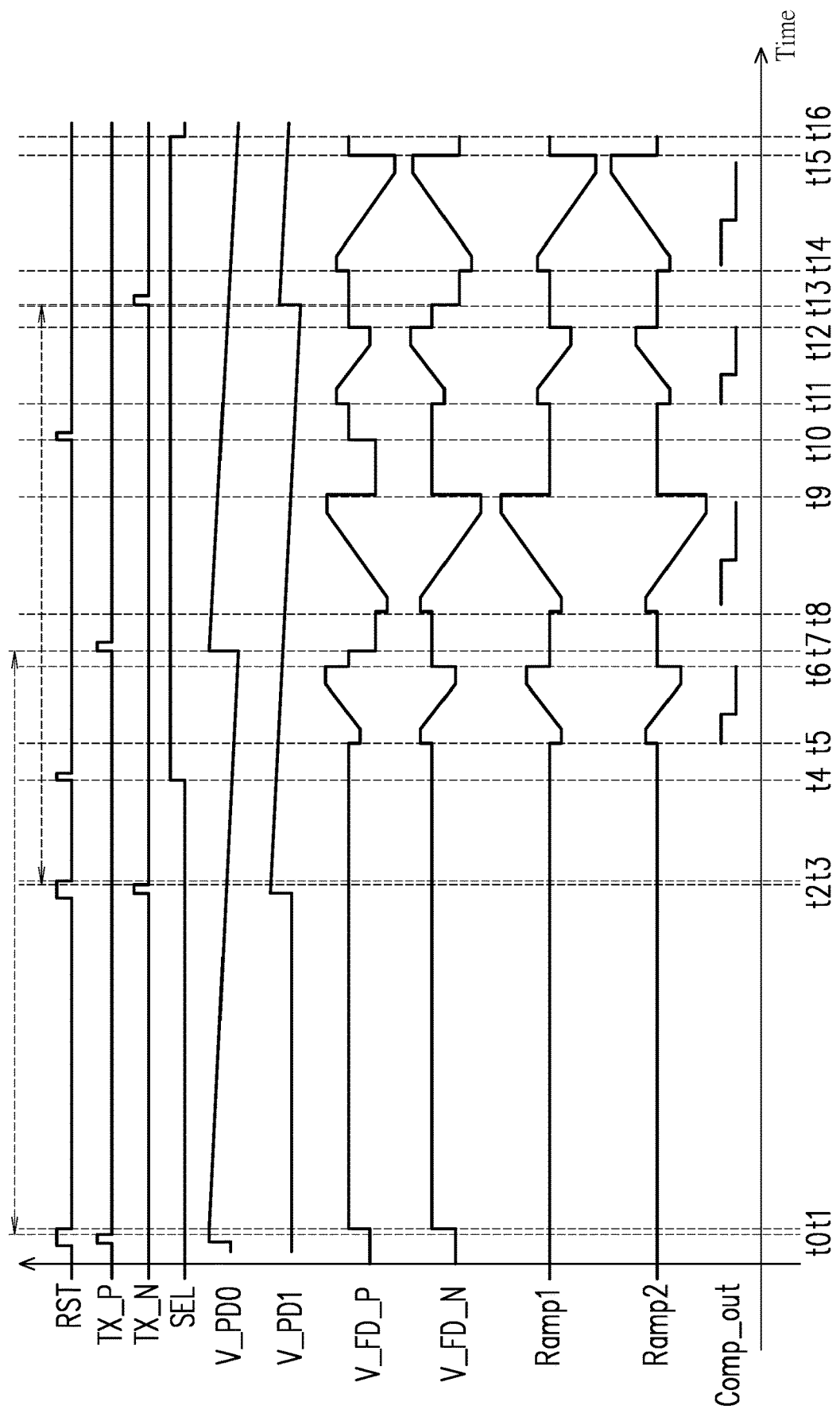
FIG. 9 is a schematic wave diagram of a plurality of signals and voltages according to an embodiment of the disclosure.

FIG. 9 is a schematic waveform diagram of a plurality of signals and voltages according to an embodiment of the disclosure. Referring to FIG. 9, a period from time t0 to time t7 is an exposure period of the first pixel unit PD0, and a voltage V_PD0 of the first pixel unit PD0 gradually decreases due to charges generated by absorption of photons during a sensing process. A period from time t2 to time t13 is an exposure period of the second pixel unit PD1, and a voltage V_PD1 of the second pixel unit PD1 gradually decreases due to charges generated by absorption of photons during the sensing process. At time t0, the reset signal RST may be at a high voltage level to turn on the first reset transistor T4_P and the second reset transistor T4_N, and the first transfer signal TX_P may be at the high voltage level to turn on the first transfer transistor T3_P. In this way, a voltage V_FD_P of the first floating diffusion node FD_P and the voltage V_PD0 of the first pixel unit PD0 may be reset to the operating voltage VDD. At time t1, the reset signal RST and the first transfer signal TX_P may be restored to a low voltage level. At time t2, the reset signal RST may be at the high voltage level to turn on the first reset transistor T4_P and the second reset transistor T4_N, and the second transfer signal TX_N may be at the high voltage level to turn on the second transfer transistor T3_N. In this way, a voltage V_FD_N of the second floating diffusion node FD_N and the voltage V_PD1 of the second pixel unit PD1 may be reset to the operating voltage VDD. At time t3, the reset signal RST and the second transfer signal TX_N may be restored to the low voltage level.

At time t4, the reset signal RST may form a pulse waveform, and the selection signal SEL may be switched to the high voltage level to turn on the first selection transistor T2_P and the second selection transistor T2_N. The voltage V_FD_P of the first floating diffusion node FD_P and the voltage V_FD_N of the second floating diffusion node FD_N maintain the high voltage level due to the conduction of the first reset transistor T4_P and the second reset transistor T4_N. During the reset period from time t5 to time t6, a first ramp signal Ramp1 provided by the ramp signal generator 820 may form an up-ramp waveform, and a second ramp signal Ramp2 provided by the ramp signal generator 820 may form a down-ramp waveform, and a first analog signal may be read out from an output voltage Comp_out generated by the output terminal of the differential amplifier of the readout circuit 830. Moreover, the counter 842 of the digital circuit 840 may output a counting signal to the latch 832 of the readout circuit 830. Therefore, when a voltage waveform of the output voltage Comp_out of the differential amplifier changes (i.e., when the voltage of the first floating diffusion node FD_P exceeds a reference voltage, the voltage waveform of the output voltage Comp_out of the differential amplifier changes, where the voltage of the second floating diffusion node FD_N may be used as the reference voltage), a counting value of the current counting signal may be output to the memory 833 for recording as the first digital number. During the reset period from time t5 to time t6, the counting value of the current counting signal when the voltage waveform of the output voltage Comp_out changes is the digital number of the background signal of the first pixel unit PD0.

At time t7, the first transfer signal TX_P may form a pulse waveform to turn on the first transfer transistor T3_P. In this way, the sensing result of the first pixel unit PD0 may be transferred to the first floating diffusion node FD_P. During the readout period from time t8 to time t9, the first ramp signal Ramp1 provided by the ramp signal generator 820 may form another up-ramp waveform, and the second ramp signal Ramp2 provided by the ramp signal generator 820 may form another down-ramp waveform, so that a second analog signal may be read from the output voltage Comp_out generated by the output terminal of the differential amplifier of the readout circuit 830. Moreover, the counter 842 of the digital circuit 840 may output a counting signal to the latch 832 of the readout circuit 830. Therefore, when the voltage waveform of the output voltage Comp_out of the differential amplifier changes (i.e., when the voltage of the first floating diffusion node FD_P exceeds the reference voltage, the voltage waveform of the output voltage Comp_out of the differential amplifier changes, where the voltage of the second floating diffusion node FD_N may be used as the reference voltage), a counting value of the current counting signal may be output to the memory 833 for recording as the second digital number. During the readout period from time t8 to time t9, the counting value of the current counting signal when the voltage waveform of the output voltage Comp_out changes is the digital number of the sensing signal of the first pixel unit PD0. In this way, the image signal processor 843 of the digital circuit 840 may read the memory 833, and may subtract the second digital number from the first digital number to generate a sensing value of the sensing result with background noise removed corresponding to the first pixel unit PD0.

At time t10, the reset signal RST may form a pulse waveform, and the selection signal SEL may maintain the high voltage level to turn on the first selection transistor T2_P and the second selection transistor T2_N. The voltage V_FD_P of the first floating diffusion node FD_P and the voltage V_FD_N of the second floating diffusion node FD_N may be changed due to the conduction of the first selection transistor T2_P and the second selection transistor T2_N. During the reset period from time t11 to time t12, the first ramp signal Ramp1 provided by the ramp signal generator 820 may form a down-ramp waveform, and the second ramp signal Ramp2 provided by the ramp signal generator 820 may form an up-ramp waveform, and a third analog signal may be read out from the output voltage Comp_out generated by the output terminal of the differential amplifier of the readout circuit 830. Moreover, the counter 842 of the digital circuit 840 may output a counting signal to the latch 832 of the readout circuit 830. Therefore, when a voltage waveform of the output voltage Comp_out of the differential amplifier changes, a counting value of the current counting signal may be output to the memory 833 for recording as a third digital number. During the reset period from time t8 to time t9, the counting value of the current counting signal when the voltage waveform of the output voltage Comp_out changes is the digital number of the background signal of the second pixel unit PD1.

At time t13, the second transfer signal TX_N may form a pulse waveform to turn on the second transfer transistor T3_N. In this way, the sensing result of the second pixel unit PD1 may be transferred to the second floating diffusion node FD_N. During the readout period from time t14 to time t15, the first ramp signal Ramp1 provided by the ramp signal generator 820 may form another down-ramp waveform, and the second ramp signal Ramp2 provided by the ramp signal generator 820 may form another up-ramp waveform, so that a fourth analog signal may be read from the output voltage Comp_out generated by the output terminal of the differential amplifier of the readout circuit 830. Moreover, the counter 842 of the digital circuit 840 may output a counting signal to the latch 832 of the readout circuit 830. Therefore, when the voltage waveform of the output voltage Comp_out of the differential amplifier changes, a counting value of the current counting signal may be output to the memory 833 for recording as a fourth digital number. During the readout period from time t14 to time t15, the counting value of the current counting signal when the voltage waveform of the output voltage Comp_out changes is the digital number of the sensing signal of the second pixel unit PD1. In this way, the image signal processor 843 of the digital circuit 840 may read the memory 833, and may subtract the third digital number from the fourth digital number to generate a sensing value of the sensing result with background noise removed corresponding to the second pixel unit PD1.

Moreover, it should be noted that during the reset period, the digital circuit 840 may enable the black level correction (BLC) function, so that the counting signal output by the counter 842 has an offset value. For example, the counting value is counted from 10 instead of 0, which increases the digital number of the reset signal by 10. In this way, a sensing value of the result of subtracting the digital number of the sensing signal from the digital number of the reset signal may be reduced by 10 (sensing value drops), so as to achieve the effect of black level correction (BLC). Alternatively, in the above sensing period, the digital circuit 840 may enable the black level correction (BLC) function, so that the counting signal output by the counter 842 has an offset value. For example, the counting value is counted from 40 instead of 0, which increases the digital number of the sensing signal by 40. In this way, a sensing value of the result of subtracting the digital number of the sensing signal from the digital number of the reset signal may be increased by 40 (sensing value rises), so as to achieve the effect of black level correction (BLC).

Figure 10:
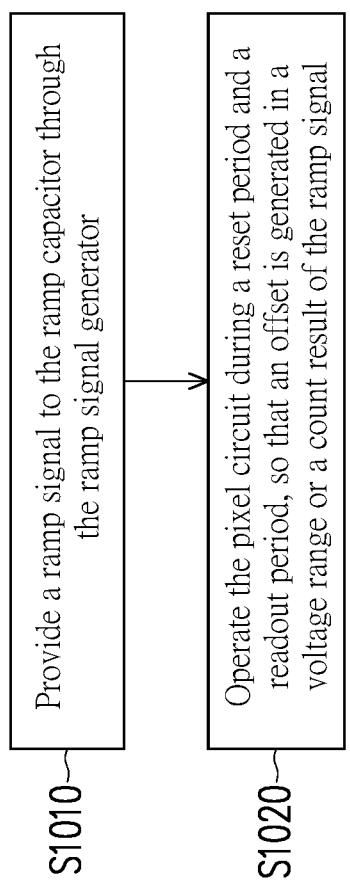
FIG. 10 is a flowchart of an operation method of an embodiment of the disclosure.

FIG. 10 is a flowchart of an operation method of an embodiment of the disclosure. The operation method of the embodiment is applicable to the image sensors 100 and 800 in the embodiments of FIG. 1 and FIG. 8. Referring to FIG. 1 and FIG. 10, in step S1010, the image sensor 100 may provide a ramp signal to the ramp capacitor Cr through the ramp signal generator 120. In step S1020, the image sensor 100 may operate the pixel circuit 110 during the reset period and the readout period, so that a voltage range or a counting result of the ramp signal may be shifted. Moreover, in the embodiment, the voltage range or the counting result of the ramp signal during at least one of the reset period and the readout period may have an offset according to the counting signal. In this regard, the specific manner of shifting the voltage range or the counting result of the ramp signal may get sufficient teaching, suggestions, and implementation instructions by referring to the descriptions of the embodiments of FIG. 1 to FIG. 9, which will not be repeated.

Alternatively, in an embodiment, the image sensor 100 may respectively read out the first analog signal and the second analog signal of the pixel unit PD through the readout circuit 130 during the reset period and the readout period, and convert the same into the first digit number and the second digit number. The image sensor 100 may directly modify at least one of the first digital number and the second digital number through the digital circuit 140 according to the offset value, and the digital circuit 140 may subtract the second digital value from the first digital value to generate a sensing value corresponding to the pixel unit PD. In other words, the image sensor 100 may only directly modify the first digital number of the signal readout result of the reset period, or the image sensor 100 may only directly modify the second digital number of the signal readout result of the readout period, and or the image sensor 100 may synchronously and directly modify the first digital number and the second digital number of the signal readout results of the reset period and the readout period. The offset value may be a fixed value or a variable value that changes frame by frame. In this way, even if signal distortion occurs in the signal readout result of at least one of the reset period and the readout period, through the above adjustment of at least one of the first digital number and the second digital number, the image sensor 100 is not liable to continuously sense distortion results at the pixel values of the sensing results (readout results) corresponding to certain specific digital numbers.

In summary, the image sensor and the operation method thereof in the disclosure may effectively avoid or reduce the occurrence of continuous signal distortion in the sensing result (readout result) generated by the image sensor at pixel values corresponding to certain specific digital values. In the image sensor and the operation method thereof of the disclosure, an offset voltage may be applied to the generated ramp signal through the ramp signal generator, so that the position where the ramp signal has a glitch will not continuously appear at a same position (corresponding to a same digital number), and the photon transfer curve of the image sensor may become smoother or reduce the occurrence of signal distortion. In addition, the linearity of the analog-to-digital converter may also be greatly improved, so that the image sensor of the disclosure may have the characteristic of good linearity of the analog-to-digital converter.

In addition, the image sensor and the operation method in the disclosure may also mitigate the above problem by directly adjusting the digital number of the sensing result through the digital circuit according to the offset value. Moreover, the image sensor and the operation method thereof in the disclosure may also achieve the effect of black level correction, by applying an offset voltage to the ramp signal, the sensing result may be increased or decreased. In addition, the image sensor and the operation method in the disclosure may also change the sensing result by changing a counting range output by the digital circuit, so as to achieve black level correction.

It will be apparent to those skilled in the art that various modifications and variations can be made to the disclosed embodiments without departing from the scope or spirit of the disclosure. In view of the foregoing, it is intended that the disclosure covers modifications and variations provided they fall within the scope of the following claims and their equivalents.

What is claimed is:
1. An image sensor, comprising:
  a first pixel circuit, comprising:
    a first pixel unit;
    a first transfer transistor, coupled to the first pixel unit and
      a first floating diffusion node;

a first readout transistor, coupled to the first floating diffusion node;

a first ramp capacitor, coupled to the first floating diffusion node, and receiving a first ramp signal; and a first reset transistor, coupled to the first floating diffusion node, and receiving a reset signal;

a ramp signal generator, coupled to the first ramp capacitor, and configured to provide the first ramp signal; and a ramp signal controller, coupled to the ramp signal generator, wherein the image sensor is a digital correlated double sampling circuit, the first ramp signal additionally generates an offset voltage through the ramp signal controller, so that a voltage range or a counting result of the pixel circuit during at least one of a reset period and a readout period has an offset, wherein the ramp signal generator provides the offset voltage during at least one of the readout period and the reset period according to a digital number.

2. The image sensor as claimed in claim 1, wherein the ramp signal generator provides the offset voltage during the readout period according to the digital number, and the offset voltage is a variable value.

3. The image sensor as claimed in claim 1, wherein the ramp signal generator provides a first offset voltage during the reset period and a second offset voltage during the readout period according to the digital number, wherein the first offset voltage and the second offset voltage are equal, and the first offset voltage and the second offset voltage are each a variable value.

4. The image sensor as claimed in claim 1, wherein the offset voltage is a variable value that changes frame by frame.

5. The image sensor as claimed in claim 1, wherein the offset voltage changes frame by frame based on a regular triangular wave.

6. The image sensor as claimed in claim 1, wherein the offset voltage changes frame by frame based on a random number.

7. The image sensor as claimed in claim 1, wherein the offset voltage is a variable value that changes row by row and frame by frame in a pixel array.

8. The image sensor as claimed in claim 7, wherein the offset voltage changes row by row and frame by frame based on a regular triangular wave, and a value of the offset voltage of the same row is different in different frames.

9. The image sensor as claimed in claim 7, wherein the offset voltage changes row by row and frame by frame based on a random number, and a value of the offset voltage of the same row is different in different frames.

10. The image sensor as claimed in claim 1, wherein the first ramp signal is generated by a folded type digital-to-analog converter.

11. The image sensor as claimed in claim 1, wherein the first ramp signal is generated by a segment type digital-to-analog converter.

12. The image sensor as claimed in claim 1, wherein the image sensor performs a photon transfer test, so that a digital circuit generates a photon transfer curve according to a plurality of sensing values generated during a continuous sensing period.

13. The image sensor as claimed in claim 1, wherein the image sensor performs a black level correction operation.

14. The image sensor as claimed in claim 1, wherein the first pixel circuit further comprises:

a first selection transistor, coupled to the readout transistor, and receiving a selection signal.

15. The image sensor as claimed in claim 1, further comprising:

a second pixel circuit, comprising:

a second pixel unit;

a second transfer transistor, coupled to the second pixel unit and a second floating diffusion node;

a second readout transistor, coupled to the second floating diffusion node;

a second ramp capacitor, coupled to the second floating diffusion node and the ramp signal generator, and receiving a second ramp signal; and a second reset transistor, coupled to the second floating diffusion node, and receiving the reset signal, wherein the ramp signal generator is further configured to provide the second ramp signal, and the first ramp signal and the second ramp signal are respectively an up-ramp signal and a down-ramp signal, wherein a voltage range or a counting result of the second ramp signal during at least one of the reset period and the readout period has an offset.

16. An image sensor, comprising:

a first pixel circuit, comprising:

a first pixel unit;

a first transfer transistor, coupled to the first pixel unit and a first floating diffusion node;

a first readout transistor, coupled to the first floating diffusion node;

a first ramp capacitor, coupled to the first floating diffusion node, and receiving a first ramp signal; and a first reset transistor, coupled to the first floating diffusion node, and receiving a reset signal;

a ramp signal generator, coupled to the first ramp capacitor, and configured to provide the first ramp signal;

a readout circuit, coupled to the first pixel circuit, and configured to respectively read out a first analog signal and a second analog signal of the first pixel unit during the reset period and the readout period, and obtain a first digital number and a second digital number according to a counting value of a current counting signal when the first floating diffusion node exceeds a reference voltage; and a digital circuit, coupled to the readout circuit, and configured to provide the counting signal to the readout circuit, wherein the digital circuit subtracts the second digital number from the first digital number to generate a sensing value, and the digital circuit modifies at least one of the first digital number and the second digital number according to an offset value before generating the sensing value.

17. The image sensor as claimed in claim 16, wherein the first pixel circuit further comprises:

a first selection transistor, coupled to the readout transistor, and receiving a selection signal.

18. The image sensor as claimed in claim 16, further comprising:

a second pixel circuit, comprising:

a second pixel unit;

a second transfer transistor, coupled to the second pixel unit and a second floating diffusion node;

a second readout transistor, coupled to the second floating diffusion node;

a second ramp capacitor, coupled to the second floating diffusion node and the ramp signal generator, and receiving a second ramp signal; and a second reset transistor, coupled to the second floating diffusion node, and receiving the reset signal, wherein the ramp signal generator is further configured to provide the second ramp signal, and the first ramp signal and the second ramp signal are respectively an up-ramp signal and a down-ramp signal, wherein a voltage of the second floating diffusion node serves as the reference voltage, wherein a voltage range or a counting result of the second ramp signal during at least one of the reset period and the readout period has an offset.

* * * * *